(12) United States Patent
Liu et al.

(10) Patent No.: US 7,957,182 B2
(45) Date of Patent: Jun. 7, 2011

(54) MEMORY CELL HAVING NONMAGNETIC FILAMENT CONTACT AND METHODS OF OPERATING AND FABRICATING THE SAME

(75) Inventors: Jun Liu, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 159 days.

(21) Appl. No.: 12/352,364

(22) Filed: Jan. 12, 2009

(65) Prior Publication Data
US 2010/0177561 A1      Jul. 15, 2010

(51) Int. Cl.
*G11C 11/14* (2006.01)
*G11C 7/00* (2006.01)
*G11C 29/82* (2006.01)

(52) U.S. Cl. .......... 365/171; 365/189.14; 257/421; 257/E29.323; 977/700

(58) Field of Classification Search .......... None
See application file for complete search history.

(56) References Cited

U.S. PATENT DOCUMENTS

| | | | |
|---|---|---|---|
| 6,379,978 B2 | 4/2002 | Goebel et al. | |
| 6,424,563 B2 | 7/2002 | Honigschmid | |
| 6,490,217 B1 | 12/2002 | DeBrosse et al. | |
| 6,847,547 B2 | 1/2005 | Albert et al. | |
| 6,896,975 B2 | 5/2005 | Lin et al. | |
| 6,982,916 B2 | 1/2006 | Tsang | |
| 6,992,359 B2 | 1/2006 | Nguyen et al. | |
| 7,009,877 B1 | 3/2006 | Huai et al. | |
| 7,042,762 B2 | 5/2006 | Nakamura et al. | |
| 7,045,368 B2 | 5/2006 | Hong et al. | |
| 7,088,609 B2 | 8/2006 | Valet | |
| 7,126,202 B2 | 10/2006 | Huai et al. | |
| 7,211,874 B2 | 5/2007 | Guo et al. | |
| 7,224,601 B2 | 5/2007 | Panchula | |
| 7,230,844 B2 | 6/2007 | Deak | |

(Continued)

FOREIGN PATENT DOCUMENTS

WO    WO2008010957    1/2008

OTHER PUBLICATIONS

Ozatay et al. (Applied Phisics Letters, 2006, "Spin transfer by non-uniform current injection into a nanomagnet").*

*Primary Examiner* — Huan Hoang
*Assistant Examiner* — James G Norman
(74) *Attorney, Agent, or Firm* — Fletcher Yoder

(57) ABSTRACT

A magnetic cell structure including a nonmagnetic filament contact, and methods of fabricating the structure are provided. The magnetic cell structure includes a free layer, a pinned layer, an insulative layer between the free and pinned layers, and a nonmagnetic filament contact in the insulative layer which electrically connects the free and pinned layers. The nonmagnetic filament contact is formed from a nonmagnetic source layer, also between the free and pinned layers. The filament contact directs a programming current through the magnetic cell structure such that the cross sectional area of the programming current in the free layer is less than the cross section of the structure. The decrease in the cross sectional area of the programming current in the free layer enables a lower programming current to reach a critical switching current density in the free layer and switch the magnetization of the free layer, programming the magnetic cell.

29 Claims, 4 Drawing Sheets

U.S. PATENT DOCUMENTS

| | | |
|---|---|---|
| 7,257,021 B2 | 8/2007 | Lienau et al. |
| 7,282,755 B2 | 10/2007 | Pakala et al. |
| 7,307,876 B2 | 12/2007 | Kent et al. |
| 7,310,265 B2 | 12/2007 | Zheng et al. |
| 7,339,819 B2 | 3/2008 | Johnson |
| 7,369,427 B2 | 5/2008 | Diao et al. |
| 7,372,722 B2 | 5/2008 | Jeong et al. |
| 7,430,135 B2 | 9/2008 | Huai et al. |
| 7,433,161 B2 | 10/2008 | Ikarashi et al. |
| 2006/0262594 A1 | 11/2006 | Fukumoto |
| 2008/0049488 A1 | 2/2008 | Rizzo |
| 2008/0061388 A1 | 3/2008 | Diao et al. |
| 2008/0180991 A1 | 7/2008 | Wang |
| 2008/0197431 A1 | 8/2008 | Morise et al. |
| 2008/0225585 A1 | 9/2008 | Ranjan et al. |
| 2008/0265234 A1 | 10/2008 | Breitwisch et al. |
| 2009/0162698 A1* | 6/2009 | Fukuzawa et al. ......... 428/811.2 |
| 2010/0117170 A1* | 5/2010 | Tang et al. .................... 257/421 |

* cited by examiner

MEMORY CELL HAVING NONMAGNETIC FILAMENT CONTACT AND METHODS OF OPERATING AND FABRICATING THE SAME

BACKGROUND

1. Field of Invention

Embodiments of the invention relate generally to magnetic random access memory, and more particularly, to Spin Torque Transfer Magnetic Random Access Memory (STT-MRAM).

2. Description of Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light and not as admissions of prior art.

Magnetic Random Access Memory (MRAM) is a non-volatile computer memory technology based on magnetoresistance. MRAM differs from volatile Random Access Memory (RAM) in several respects. Because MRAM is non-volatile, MRAM can maintain memory content when the memory device is not powered. Though non-volatile RAM is typically slower than volatile RAM, MRAM has read and write response times that are comparable to that of volatile RAM. Unlike typical RAM technologies which store data as electric charge, MRAM data is stored by magnetoresistive elements. Generally, the magnetoresistive elements are made from two magnetic layers, each of which holds a magnetization. The magnetization of one layer (the "pinned layer") is fixed in its magnetic orientation, and the magnetization of the other layer (the "free layer") can be changed by an external magnetic field generated by a programming current. Thus, the magnetic field of the programming current can cause the magnetic orientations of the two magnetic layers to be either parallel, giving a lower electrical resistance across the layers ("0" state), or antiparallel, giving a higher electrical resistance across the layers ("1" state). The switching of the magnetic orientation of the free layer and the resulting high or low resistance states across the magnetic layers provide for the write and read operations of the typical MRAM cell.

Though MRAM technology offers non-volatility and faster response times, the MRAM cell is limited in scalability and susceptible to write disturbances. The programming current employed to switch between high and low resistance states across the MRAM magnetic layers is typically high. Thus, when multiple cells are arranged in an MRAM array, the programming current directed to one memory cell may induce a field change in the free layer of an adjacent cell. This potential for writes disturbances, also known as the "half-select problem," can be addressed using a spin torque transfer technique.

A conventional spin torque transfer MRAM (STT-MRAM) cell may include a magnetic cell stack, which may be a magnetic tunnel junction (MTJ) or a spin valve structure. An MTJ is a magnetoresistive data storing element including two magnetic layers (one pinned and one free) and an insulating layer in between, a bit line, a word line, a source line, and an access transistor. A spin valve has a structure similar to the MTJ, except a spin valve has a conductive layer in between the two magnetic layers. A programming current typically flows through the access transistor and the magnetic cell stack. The pinned layer polarizes the electron spin of the programming current, and torque is created as the spin-polarized current passes through the stack. The spin-polarized electron current interacts with the free layer by exerting a torque on the free layer. When the torque of the spin-polarized electron current passing through the stack is greater than the critical switching current density ($J_c$), the torque exerted by the spin-polarized electron current is sufficient to switch the magnetization of the free layer. Thus, the magnetization of the free layer can be aligned to be either parallel or antiparallel to the pinned layer, and the resistance state across the stack is changed.

The STT-MRAM has advantageous characteristics over the MRAM, because the spin-polarized electron current eliminates the need for an external magnetic field to switch the free layer in the magnetoresistive elements. Further, scalability is improved as the programming current decreases with decreasing cell sizes, and the write disturbance and half-select problem is addressed. Additionally, STT-MRAM technology allows for a higher tunnel magnetic resistance ratio, meaning there is a larger ratio between high and low resistance states, improving read operations in the magnetic domain.

However, high programming current densities through the STT-MRAM cell may still be problematic. High current densities through the magnetic layers may increase the energy consumption in the cell and the thermal profile in the layers, affecting the cell's integrity and reliability, and may also lead to larger silicon real estate consumption for each cell.

BRIEF DESCRIPTION OF DRAWINGS

Certain embodiments are described in the following detailed description and in reference to the drawings in which.

DETAILED DESCRIPTION

As previously discussed, a spin torque transfer magnetic random access memory (STT-MRAM) cell is programmed by switching the magnetization of the free layer in the STT-MRAM cell's magnetic cell stack. Typically, the free layer magnetization can be in a direction either parallel to the pinned layer magnetization, or antiparallel to the pinned layer magnetization. When the magnetizations of the free and pinned layers are parallel, the resistance across the layers may be low, and when the magnetizations of the free and pinned layers are antiparallel, the resistance may be high. Thus, an STT-MRAM cell may be programmed to either a low or a high resistance state.

Figure 1:
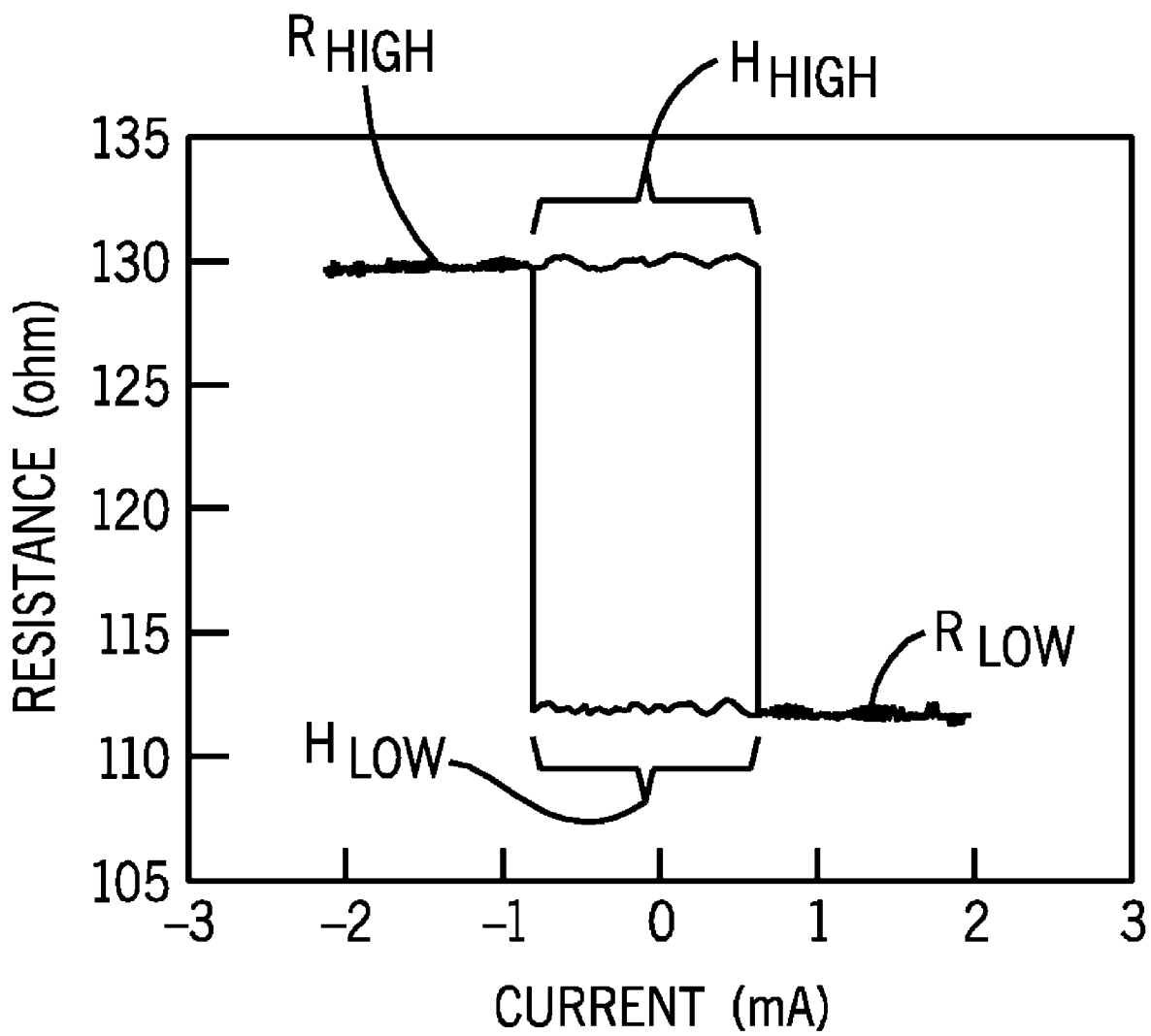
FIG. 1 depicts a graph illustrating the relationship between programming current direction and the resistance states in an STT-MRAM cell, in accordance with an embodiment of the present technique.

Switching of the free layer magnetization (and of the resistance state of the cell) occurs when the current density passing through the memory cell is larger than the critical switching current density. An example of how the resistance across a magnetic cell structure in an STT-MRAM cell may change based on a programming current is depicted in the graph of FIG. 1. The values used in this graph are examples to illustrate a general relationship between a programming current and STT-MRAM cell resistance states. STT-MRAM cells, in embodiments of the present technique, may be programmed with different current values, and may have various resistance values in different programmed states. In the graph of FIG. 1, the cell is programmed to a high resistance state $R_{HIGH}$ at approximately 130 ohms when the programming current is below −1 mA. The cell is programmed to a low resistance state $R_{LOW}$ at approximately 111 ohms when the programming current is above 1 mA. The negative and positive programming current values may indicate that the programming current is applied in opposite directions through the magnetic cell stack. Programming currents in opposite directions may have electrons with spin polarization directions that switch the free layer magnetization in opposite directions (i.e., parallel or antiparallel to the pinned layer magnetization).

When the current through the cell is not below −1 mA or not above 1 mA, then the programming current may not be great enough to switch the free layer magnetization. More specifically, the current density in the free layer may not reach the critical switching current density of the free layer. If the programming current does not have a current density in the free layer that is sufficient to switch the magnetization, the cell may be at either resistance state, as indicated by hysteresis segments $H_{HIGH}$ and $H_{LOW}$ when the current is between −1 mA and 1 mA.

Thus, to program the cell, the programming current density need only be slightly higher than the critical switching current density. Since passing a larger programming current increases the energy consumption and the thermal profile in the cell stack, which affects the integrity and reliability of the cell, it is desirable to decrease the critical switching current without affecting the cell's thermal stability. Applying a lower programming current while maintaining a programming current density that is above the critical switching current density would allow a smaller current to switch the free layer of the cell. The following discussion describes the systems and devices, and the operation of such systems and devices in accordance with the embodiments of the present technique.

Figure 2:
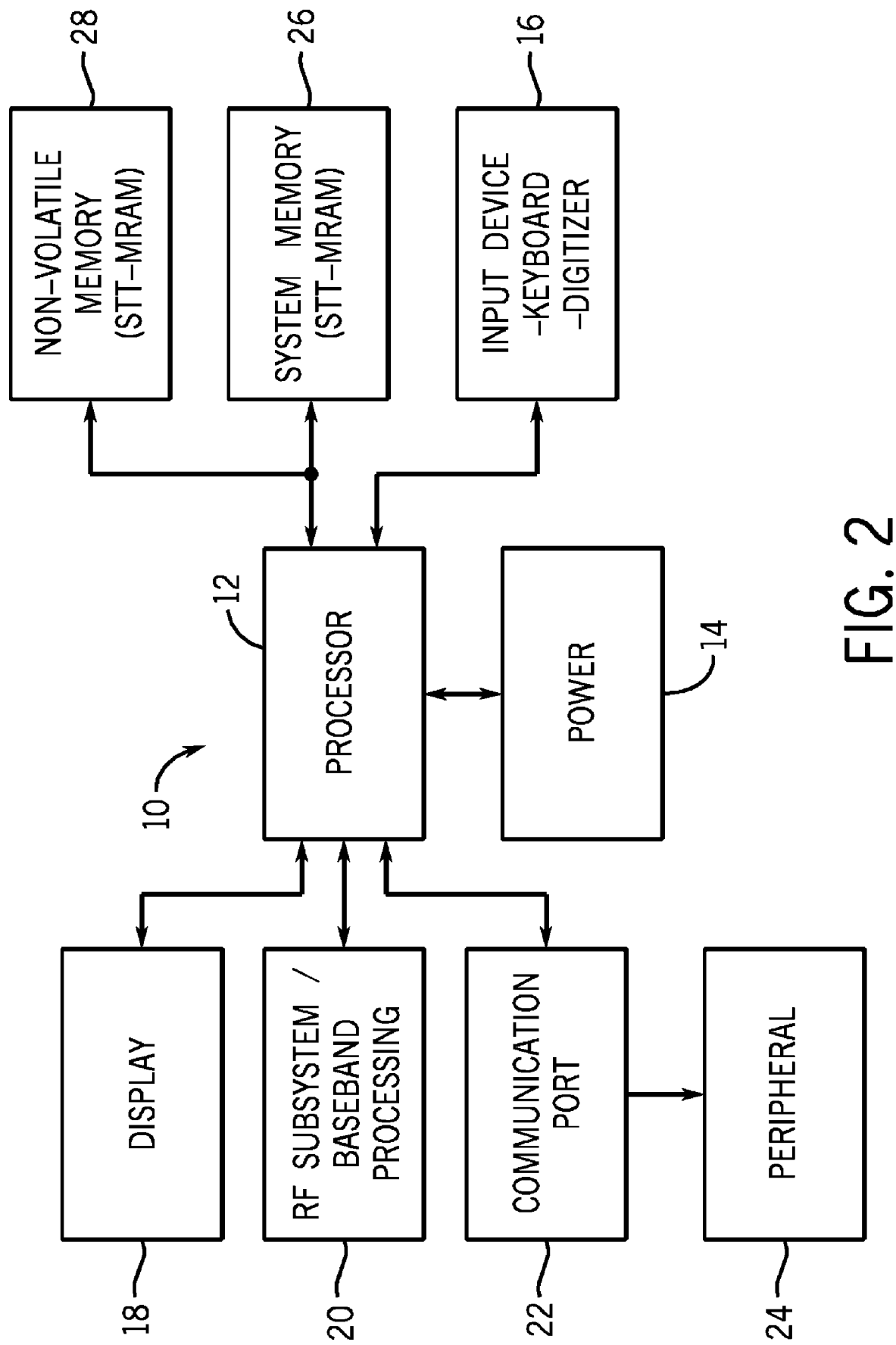
FIG. 2 depicts a block diagram of a processor-based system in accordance with an embodiment of the present technique.

FIG. 2 depicts a processor-based system, generally designated by reference numeral 10. As is explained below, the system 10 may include various electronic devices manufactured in accordance with embodiments of the present technique. The system 10 may be any of a variety of types such as a computer, pager, cellular phone, personal organizer, control circuit, etc. In a typical processor-based system, one or more processors 12, such as a microprocessor, control the processing of system functions and requests in the system 10. As is explained below, the processor 12 and other subcomponents of the system 10 may include resistive memory devices manufactured in accordance with embodiments of the present technique.

The system 10 typically includes a power supply 14. For instance, if the system 10 is a portable system, the power supply 14 may advantageously include a fuel cell, a power scavenging device, permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, a digitizer and stylus, and/or a voice recognition system, for instance. A display 18 may also be coupled to the processor 12. The display 18 may include an LCD, an SED display, a CRT display, a DLP display, a plasma display, an OLED display, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communication port 22 may be adapted to be coupled to one or more peripheral devices 24 such as a modem, a printer, a computer, or to a network, such as a local area network, remote area network, intranet, or the Internet, for instance.

The processor 12 generally controls the system 10 by implementing software programs stored in the memory. The software programs may include an operating system, database software, drafting software, word processing software, and/or video, photo, or sound editing software, for example. The memory is operably coupled to the processor 12 to store and facilitate execution of various programs. For instance, the processor 12 may be coupled to the system memory 26, which may include spin torque transfer magnetic random access memory (STT-MRAM), magnetic random access memory (MRAM), dynamic random access memory (DRAM), and/or static random access memory (SRAM). The system memory 26 may include volatile memory, non-volatile memory, or a combination thereof. The system memory 26 is typically large so that it can store dynamically loaded applications and data. In some embodiments, the system memory 26 may include STT-MRAM devices, such as those discussed further below.

The processor 12 may also be coupled to non-volatile memory 28, which is not to suggest that system memory 26 is necessarily volatile. The non-volatile memory 28 may include STT-MRAM, MRAM, read-only memory (ROM), such as an EPROM, resistive read-only memory (RROM), and/or flash memory to be used in conjunction with the system memory 26. The size of the ROM is typically selected to be just large enough to store any necessary operating system, application programs, and fixed data. Additionally, the non-volatile memory 28 may include a high capacity memory such as a tape or disk drive memory, such as a hybrid-drive including resistive memory or other types of non-volatile solid-state memory, for instance. As is explained in greater detail below, the non-volatile memory 28 may include STT-MRAM devices manufactured in accordance with embodiments of the present technique.

Figure 3:
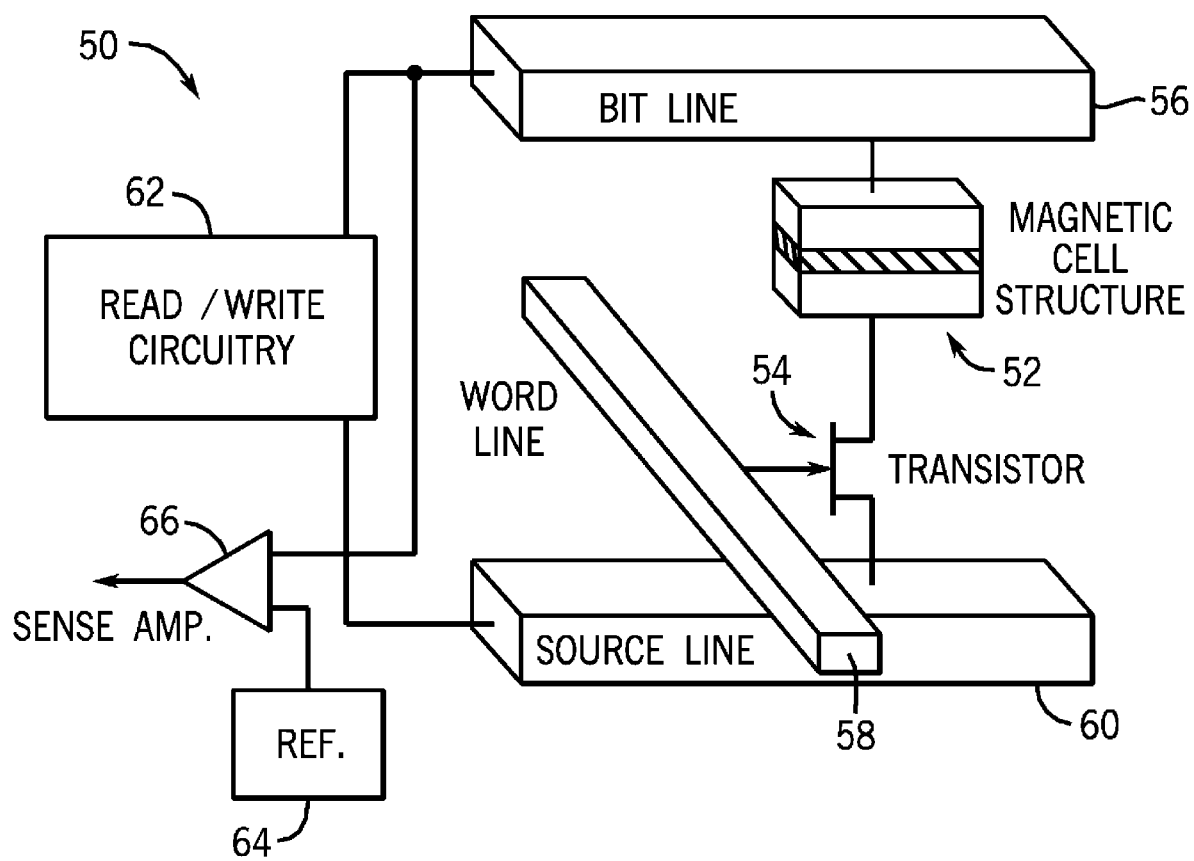
FIG. 3 depicts a schematic diagram of a portion of a memory array having memory cells fabricated in accordance with embodiments of the present technique.

FIG. 3 illustrates an STT-MRAM cell 50, which may be fabricated to form an array of memory cells in a grid pattern including a number of rows and columns, or in various other arrangements depending on the system requirements and fabrication technology. An arrangement of memory cells may be implemented in the system memory 26 or the volatile memory 28 depicted in FIG. 2.

The STT-MRAM cell 50 includes a magnetic cell structure 52, an access transistor 54, a bit line 56, a word line 58, a source line 60, read/write circuitry 62, a bit line reference 64, and a sense amplifier 66. The magnetic cell structure 52 may include a spin valve. As will be described further below with specific reference to FIGS. 4A-4B, the structure 52 may further include a nonmagnetic contact between the free and pinned layers in accordance with embodiments of the present technique. In embodiments described below, the nonmagnetic contact in the structure 52 may be a filament or filaments disposed or formed within the structure 52, and may be formed from nonmagnetic material layered in the structure 52.

As used herein, the STT-MRAM cell 50 generally includes a "magnetic cell structure." The magnetic cell structure may be a spin valve, as discussed above, if a nonmagnetic conductive layer is between a free layer and a pinned layer. As used in the present specification, the term "structure" may include a magnetic cell structure, and may refer to a memory cell structure, magnetic cell structure, STT-MRAM cell structure, or any component of a memory cell which may include layers and materials in accordance with an embodiment of the present technique. The term "structure" may also refer to transitional structures during processes to fabricate the magnetic cell structure, or a structure that has been altered from a previously fabricated structure, in accordance with embodiments of the present techniques.

As will be explained, the term "contact" may refer to a filament, a bridge, a strip, or some other formation which provides a path or electrical connection between the free layer and the pinned layer. The contact may comprise nonmagnetic materials from a layer of nonmagnetic material in the structure. As used herein, materials may be referred to as a "layer" when the material is formed above, below, or within the structure. A layer may be either parallel or perpendicular to the structure. In accordance with embodiments described below, the nonmagnetic layer may form a nonmagnetic contact through nanochannel(s), which may extend substantially perpendicularly through an adjacent layer(s). Such nanochannels may be formed by applying an electric field, for example, or by any other process(es) in accordance with embodiments of the present technique. It should be understood that when a layer is said to be "formed on," "formed below," "disposed on," or "disposed below" another layer, there may be intervening layers formed or disposed between those layers. Conversely, if a layer or material is said to be "formed directly on," "formed directly below," "disposed directly on," "disposed directly below," or "in direct contact with," the materials or layers include no intervening materials or layers therebetween.

During a write operation of an STT-MRAM cell 50 that is selected to be programmed, a programming current is applied to the cell. The electrons of the programming current are spin-polarized by the pinned layer to exert a torque on the free layer, which switches the magnetization of the free layer to "write to" or "program" the cell. To initiate the write operation, the read/write circuitry 62 may generate a write current to the bit line 56 and the source line 60. The polarity of the voltage between the bit line 56 and the source line 60 determines the switch in magnetization of the free layer in the structure 52. Furthermore, and as discussed in detail below, forming a filament of nonmagnetic material to electrically connect the free and pinned layers may direct a programming current flow through the magnetic cell structure 52 to decrease the cross sectional area of the programming current flow in the free layer of the structure 52. By decreasing the cross sectional area of the programming current through the free layer, a smaller programming current may still have a current density in the free layer that is greater than the critical switching current density required to switch the free layer magnetization. Thus, a smaller programming current may be used to write the STT-MRAM cell 50. Once the free layer is magnetized according to the spin polarity of the programming current electrons, the programmed state is written to the STT-MRAM cell 50.

In a read operation of the STT-MRAM cell 50, a current is used to detect the resistance state of the magnetic cell structure 52. To initiate a read operation, the read/write circuitry 62 generates a read current to the bit line 56 and the source line 60 through the structure 52 and the transistor 54. The programmed state of the STT-MRAM cell 50 depends on the resistance across the structure 52 which may be determined by the voltage difference between the bit line 56 and the source line 60. In some embodiments, the voltage difference may be compared to a reference 64 and amplified by a sense amplifier 66.

Figure 4A:
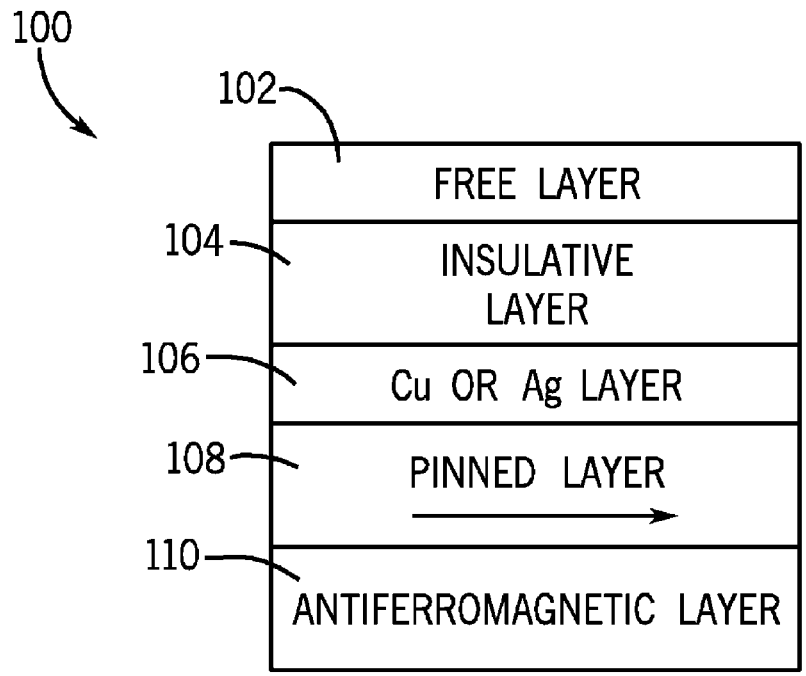
FIG. 4A and FIG. 4B depict STT-MRAM cell structures before and after a nonmagnetic filament contact is formed, in accordance with embodiments of the present technique.
Figure 4B:
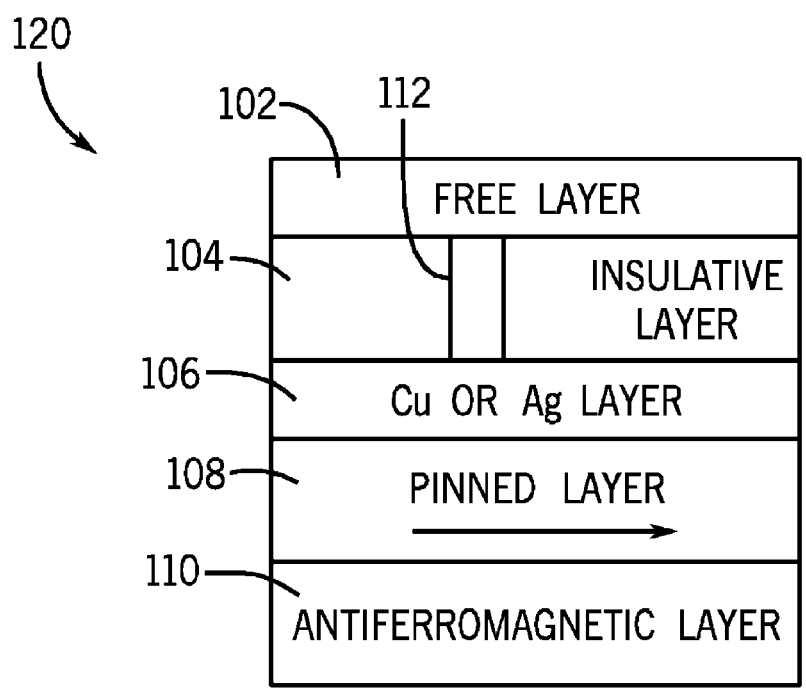

One embodiment of the present techniques for programming a STT-MRAM cell with a decreased programming current, is illustrated in FIGS. 4A and 4B. In one embodiment, the STT-MRAM cell includes a memory cell structure 120 (FIG. 4B) having nonmagnetic filament contact 112 which may be employed to decrease the cross sectional area of the programming current flow. As will be further explained, this technique enables a lower programming current to facilitate a switch in the magnetization of the free layer 102 to program the memory cell.

The memory cell structure 100 of FIG. 4A may include a free layer 102 and a pinned layer 108 with an insulative layer 104 and a nonmagnetic source layer 106 in between. The pinned layer 108 is so named because it has a magnetization with a fixed or preferred orientation, and this is represented by the arrow indicating that the magnetization of the pinned layer 108 is oriented to the right. The free layer 102 has a magnetization which may be switched to allow the memory cell to be programmed. The structure 100 may also include an antiferromagnetic layer 110 below the pinned layer 108 to achieve the pinning through exchange coupling and further increase cell stability.

The structure 100 of FIG. 4A may be altered to achieve an STT-MRAM cell that is programmable with lower programming current. An example of how the structure 100 may appear after it is altered to achieve an STT-MRAM cell in accordance with embodiments of the present technique is depicted in the altered structure 120 of FIG. 4B. The altered structure 120 may include all the elements of the original structure 100, and may further include a nonmagnetic filament contact 112 which provides a connection between the free layer 102 and the pinned layer 106 through the insulative layer 104. One example of how the nonmagnetic filament contact 112 may be formed is to apply a high voltage to the structure 100 of FIG. 4A. The electric field in the structure 100 may cause the insulative layer 104 to break, such that a nanochannel may be formed within the insulative layer 104. Nonmagnetic material from the nonmagnetic source layer 106 may fill a nanochannel to create the nonmagnetic filament contact 112. While the insulative layer 104 in the original structure 100 may substantially block a current travelling through the stack, the nonmagnetic filament contact 112 formed in the altered structure 120 may provide a current path through the insulative layer 104 to connect the free and pinned layers 102 and 108. This current path may have a cross section that is significantly smaller than the cross section of the magnetic cell structure 100 or 120.

As previously discussed, the STT-MRAM cell may be programmed by switching the magnetization of the free layer to be either parallel to the magnetization of the pinned layer (low resistance state) or antiparallel to the magnetization of the pinned layer (high resistance state). To switch the free layer magnetization, a programming current may be applied perpendicularly through the layers of an STT-MRAM cell structure. Since the programming current flows axially through the free layer, the programming current density in the free layer of a typical STT-MRAM cell would be the programming current per cross sectional area, or the electric current in amperes, divided by the cross section (i.e., width*depth) of the free layer. However, as discussed below in accordance with embodiments of the present invention, the programming current can be reduced without reducing the cross section and/or the volume of the free layer 102.

In embodiments of the present techniques, a programming current may be applied through the magnetic cell structure 120 and may flow from the pinned layer 108 to the nonmagnetic source layer 104 and through the nonmagnetic filament contact 112 to the free layer 102. The cross section of the filament contact 112 may be significantly smaller than the cross section of the structure 120 or other layers in the structure 120. The flow of the programming current is limited to the cross section of the filament contact 112 because the material surrounding the filament contact 112 is insulative material 104. Since the cross sectional area of the programming current flow is limited immediately prior to flowing through the free layer 102, the cross sectional area of the programming current flow through the free layer 102 may also be substantially determined by the cross section of the filament contact 112. This may produce a programming current path with a reduced cross sectional area through the free layer 102. In some embodiments, the switch of magnetization in a portion of the free layer 102 may also propagate through the rest of the free layer 102 after some period of time.

A reduced cross sectional area of the current flow in the free layer 102 has an inverse effect on the programming current density in the free layer 102, as shown in the equation calculating current density:

$$I=J_c*A,$$

where I represents a current, $J_c$ represents current density, and A represents the cross sectional area of the current. As seen in this equation, A and $J_c$ are inversely related. Thus, when the cross sectional area of a current is reduced, a proportionally reduced current can maintain the same current density.

In the present structure 120, and in embodiments of the present techniques, the cross sectional area of the programming current through the free layer 102 may be significantly smaller because the current flows to the free layer 102 from the filament contact 112, which has a much smaller cross section (i.e., the thickness of the filament contact 112). Because of the inverse relationship between the cross sectional area of current and the current density, the smaller cross sectional area of current flow through the free layer 102 may enable a lower programming current to have a current density that is still greater than the critical switching current density. When a current density through the free layer 102 is greater than a critical switching current density, the free layer magnetization may be switched. Thus, in some embodiments, a smaller programming current may switch the magnetization of the free layer 102, or a portion of the free layer 102. In embodiments, the magnetization switch in the portion of the free layer 102 may propagate through the volume of the free layer, such that all or substantially all of the free layer 102 may switch in magnetization.

Read operations may also involve sending a read current, which may flow through the cell to determine the resistance between the free layer 102 and the pinned layer 108. As the read current may also flow through the nonmagnetic filament contact 112, the path of the read current through the free layer 102 may also be limited to an area that is approximately the thickness of the filament contact 112. Therefore, the read current may measure the resistance of the structure 120 through the portion of the free layer 102 that has been switched by the programming current.

Although the FIG. 4B depicts a nonmagnetic filament contact 112 extending perpendicularly from the nonmagnetic source layer 106, the filament contact 112 may be formed to have any shape that electrically connects the free layer 102 and the pinned layer 108. For example, when an electric field causes the insulative layer 104 to break, the nanochannel(s) formed in the insulative layer 104 may take random shapes. Since the shape of the nanochannel(s) may differ, the cross section of the filament contact 112 may not be uniform throughout different magnetic cell structures 120. It is also possible that more than one nanochannel, and more than one filament contact 112 may be formed in the insulative layer 104, and partial nanochannels may also occur in the insulative layer 104, for a given memory cell.

Generating an electric field in the structure 100 is an example of how a nonmagnetic filament contact 112 may be formed in a magnetic cell structure. For example, a high voltage of approximately 3-5 volts may generate an electric field sufficient to form nanochannels in the insulative layer 104. However, any other suitable method, for example, field driven solid electrolyte filament formation, may form nanochannels, or nonmagnetic filament contacts 112 in accordance with the present techniques. Furthermore, the formation of the filament contact 112 may occur during or after the fabrication of the original structure 100. For example, the filament contact 112 may be formed during the testing of the cell. The filament contact 112 may also be formed during the first write process of the cell.

The examples of materials discussed below may be used in embodiments in accordance with the present technique. In some embodiments, the free layer 102 and the pinned layer 108 may comprise ferromagnetic materials, such as Co, Fe, Ni or its alloys, NiFe, CoFe, CoNiFe, or doped alloys CoX, CoFeX, CoNiFeX (X=B, Cu, Re, Ru, Rh, Hf, Pd, Pt, C), or other half-metallic ferromagnetic material such as Fe3O4, CrO2, NiMnSb and PtMnSb, and BiFeO, for instance. The nonmagnetic source layer 106 and the nonmagnetic filament contact 112 may comprise materials such as Cu, Ag, any other suitable conductive nonmagnetic materials, or any combination of the above materials, and may have a thickness of approximately 5-15 nm. The insulative layer 104 may comprise materials such as SiN, SiC, or any other suitable dielectric. The insulative layer 104 may also comprise chalcogenide material, such as GeSe or GeS, or any combination of the above materials, and may have a thickness of approximately 10 nm-30 nm.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A magnetic cell structure comprising:
    a free layer;
    a pinned layer;
    a source layer disposed between the free layer and the pinned layer;
    an insulative layer disposed between the free layer and the pinned layer, wherein the insulative layer comprises a break formed by an electric field generated in the insulative layer; and a filament contact electrically coupling the free layer and the pinned layer, wherein the filament contact is disposed in the break of the insulative layer.

2. The magnetic cell structure, as set forth in claim 1, wherein the free layer and the pinned layer comprise ferromagnetic materials.

3. The magnetic cell structure, as set forth in claim 1, wherein the filament contact is formed through the insulative layer in a direction substantially parallel to the magnetic cell structure.

4. The magnetic cell structure, as set forth in claim 1, wherein the filament contact extends from the source layer.

5. The magnetic cell structure, as set forth in claim 1, wherein the filament contact and the source layer comprise Cu, Ag, any other suitable nonmagnetic conductive material, or any combination thereof.

6. The magnetic cell structure, as set forth in claim 1, arranged such that during operation, a programming current flows in a first direction from the pinned layer to the source layer, and through the filament contact to the free layer, or in a direction opposite from the first direction.

7. The magnetic cell structure, as set forth in claim 1, arranged such that during operation, a cross sectional area of a programming current in the free layer is less than a cross section of the magnetic cell structure.

8. The magnetic cell structure, as set forth in claim 1, arranged such that during operation, a cross sectional area of a programming current in the free layer is substantially similar to a cross sectional area of the programming current in the filament contact.

9. A memory cell comprising:
a pinned ferromagnetic layer;
a nonmagnetic source layer formed on the pinned ferromagnetic layer;
an insulative layer formed on the nonmagnetic source layer;
a free ferromagnetic layer formed on the insulative layer; and
a nonmagnetic filament contact electrically coupled between the pinned ferromagnetic layer and the free ferromagnetic layer, wherein the nonmagnetic filament contact is formed in a nanochannel in the insulative layer by applying a voltage which causes breaks in the insulative layer, enabling materials from the nonmagnetic source layer to fill the nanochannels.

10. The memory cell, as set forth in claim 9, comprising an antiferromagnetic layer beneath the pinned ferromagnetic layer.

11. The memory cell, as set forth in claim 9, wherein the nonmagnetic filament contact comprises materials formed from the nonmagnetic source layer.

12. The memory cell, as set forth in claim 9, wherein the nonmagnetic filament contact is formed within the insulative layer.

13. The memory cell, as set forth in claim 9, wherein the nanochannel is formed by generating an electric field in the insulative layer.

14. The memory cell, as set forth in claim 9, wherein the memory cell comprises an access transistor electrically coupled to the memory cell and configured to provide electrical access to the memory cell.

15. The memory cell, as set forth in claim 14, wherein:
a gate of the access transistor is coupled to a word line of a memory array; and
the memory cell is electrically coupled between a bit line and a source line to facilitate reading from and writing to the memory cell.

16. A method of operating a memory cell comprising:
directing a programming current through an insulative layer in the memory cell to form nanochannels in the insulative layer, such that nonmagnetic materials fill the nanochannels to form a nonmagnetic filament contact which electrically couples to a free layer in the memory cell;
directing the programming current through the free layer in the memory cell such that a cross sectional area of the programming current through the free layer is substantially similar to a cross sectional area of the programming current through the nonmagnetic filament contact; and
programming the memory cell.

17. The method, as set forth in claim 16, wherein the nonmagnetic filament contact electrically couples the free layer and a pinned layer in the memory cell.

18. The method, as set forth in claim 17, wherein nonmagnetic materials from a nonmagnetic source layer in the memory cell fill the nanochannels.

19. The method, as set forth in claim 16, comprising:
directing the programming current to flow through the nonmagnetic filament contact, wherein a cross section of the nonmagnetic filament contact is smaller than a cross section of the memory cell.

20. The method, as set forth in claim 19, wherein the programming current is directed in a first direction from a pinned layer in the memory cell to a nonmagnetic source layer, through the nonmagnetic filament contact, and through the free layer, or in a direction opposite from the first direction.

21. The method, as set forth in claim 16, wherein the memory cell is programmed when a density of the programming current through the free layer is high enough to switch a magnetization of the free layer to be either parallel or antiparallel to a magnetization of a pinned layer in the memory cell.

22. The method, as set forth in claim 16, wherein the memory cell is programmed when a density of the programming current through a portion of the free layer is high enough to switch a magnetization of the portion of the free layer to be either parallel or antiparallel to a magnetization of a pinned layer in the memory cell.

23. The method, as set forth in claim 22, wherein the magnetization of the portion of the free layer propagates through substantially all of the free layer.

24. A magnetic cell structure comprising:
a free layer;
a pinned layer;
a nonmagnetic source layer disposed between the free layer and the pinned layer; and
an insulative layer disposed between the free layer and the pinned layer, wherein the insulative layer is configured to break when voltage is applied to the magnetic cell structure, forming a nanochannel in the insulative layer, and wherein the nonmagnetic source layer is configured to fill the nanochannel in the insulative layer with nonmagnetic material.

25. The magnetic cell structure, as set forth in claim 24, wherein forming the nanochannel filled with nonmagnetic materials electrically couples the free layer and the pinned layer.

26. The magnetic cell structure, as set forth in claim 24, wherein the nanochannel filled with nonmagnetic material is formed after the magnetic cell structure is fabricated.

27. The magnetic cell structure, as set forth in claim 24, wherein the nanochannel filled with nonmagnetic material is formed during a fabrication of the magnetic cell structure.

28. The magnetic cell structure, as set forth in claim 24, arranged such that during operation, a cross sectional area of a programming current in the free layer is less than a cross section of the magnetic cell structure.

29. The magnetic cell structure, as set forth in claim 24, arranged such that during operation, a cross sectional area of a programming current in the free layer is substantially similar to a cross sectional area of the programming current in the nonmagnetic material of the nanochannel.

* * * * *